United States Patent

Wu

(10) Patent No.: US 6,836,864 B1
(45) Date of Patent: Dec. 28, 2004

(54) METHODS OF TESTING A DIGITAL FREQUENCY SYNTHESIZER IN A PROGRAMMABLE LOGIC DEVICE USING A REDUCED SET OF MULTIPLIER AND DIVIDER VALUES

(75) Inventor: Yiding Wu, Los Gatos, CA (US)

(73) Assignee: Xilinx, Inc., San Jose, CA (US)

(*) Notice: Subject to any disclaimer, the term of this patent is extended or adjusted under 35 U.S.C. 154(b) by 477 days.

(21) Appl. No.: 10/092,062

(22) Filed: Mar. 5, 2002

(51) Int. Cl.$^7$ .............................................. G01R 31/28
(52) U.S. Cl. ..................................... 714/724; 714/725
(58) Field of Search ............................... 714/724, 725, 714/731, 726; 716/16; 257/202, 209; 326/37, 38, 39, 40, 41

(56) References Cited

U.S. PATENT DOCUMENTS 6,202,182 B1 * 3/2001 Abramovici et al. ......... 714/725
6,556,044 B2 * 4/2003 Langhammer et al. ........ 326/40

OTHER PUBLICATIONS

Niewiadomski, S., Building a frequency synthesizer in an FPGA, Sep. 1998, IML Techpress, Electronic Product Design, vol. 19, No. 9, p. C32, C34, C37–8.*

Xilinx, Inc.; "Virtex–II Platform FPGA Handbook"; published Dec. 2000; available from Xilinx, Inc. 2100 Logic Drive, San Jose, CA 95124; pp. 33–75 and 168–171.

* cited by examiner

*Primary Examiner*—Albert Decady
*Assistant Examiner*—James Kerveros
(74) *Attorney, Agent, or Firm*—Lois D. Cartier

(57) ABSTRACT

Methods of testing a digital frequency synthesizer (DFS) having a programmable multiplier M and divider D. The full set of tests (wherein every value of M and D is tested) is reduced to a smaller set of tests in which each M/D ratio is tested to a specified resolution. A resolution and minimum and maximum values for M, D, and M/D are specified. An array is allocated, each M/D ratio having a corresponding location in the array, up to the specified resolution. For each MD pair meeting the specified criteria, an M/D ratio is calculated and idealized to the specified resolution, and the MD pair is stored in the corresponding array location. The result is an array of MD pairs that includes zero or one MD pair for each M/D ratio. Thus, by testing each MD pair within the array, all permissible permutations of the input clock frequency are tested.

34 Claims, 5 Drawing Sheets

METHODS OF TESTING A DIGITAL FREQUENCY SYNTHESIZER IN A PROGRAMMABLE LOGIC DEVICE USING A REDUCED SET OF MULTIPLIER AND DIVIDER VALUES

FIELD OF THE INVENTION

The invention relates to testing Programmable Logic Devices (PLDs). More particularly, the invention relates to methods for efficiently testing digital frequency synthesizer circuits included in the PLDs.

BACKGROUND OF THE INVENTION

Programmable logic devices (PLDs) are a well-known type of digital integrated circuit that can be programmed to perform specified logic functions. One type of PLD, the field programmable gate array (FPGA), typically includes an array of configurable logic blocks (CLBs) surrounded by a ring of programmable input/output blocks (IOBs). The CLBs and IOBs are interconnected by a programmable interconnect structure.

Some FPGAs also include additional logic blocks with special purposes. For example, the Xilinx Virtex®-II FPGA includes blocks of Random Access Memory (RAM) and blocks implementing multiplier functions. (The Xilinx Virtex-II FPGA is described in detail in pages 33–75 of the "Virtex-II Platform FPGA Handbook", published December 2000, available from Xilinx, Inc., 2100 Logic Drive, San Jose, Calif. 95124, which pages are incorporated herein by reference.)

Another special-purpose logic block included in the Virtex-II FPGA is a Digital Frequency Synthesizer (DFS) circuit. This circuit is described in pages 66 and 168–171 of the "Virtex-II Platform FPGA Handbook", which pages are incorporated herein by reference.

The Virtex-II DFS circuit allows a multiplier (M) and a divider (D) to be applied to a first clock signal having a given input frequency to derive a second clock signal having a desired output frequency. The range of M is 1–4096, while the range of D is also 1–4096. Therefore, the maximum number of all M/D (M divided by D) combinations is 4096×4096=16,777,216.

Thus, to fully test the Virtex-II DFS circuit using conventional test methods would require that 16,777,216 different configuration data files (bitstreams) be created and stored, with each bitstream then being downloaded to each manufactured device and tested in operation in each device. Clearly, such a test procedure is prohibitively time-consuming. In fact, simply storing the bitstreams needed for such a test procedure would be quite impractical, as would providing the computer time necessary to generate the bitstreams and to test each manufactured device with each bitstream.

Therefore, it is desirable to provide methods for maximizing test coverage of a DFS circuit in a PLD without loading and testing every possible combination of M and D.

SUMMARY OF THE INVENTION

The invention provides methods of testing a digital frequency synthesizer (DFS) circuit in a programmable logic device (PLD), and of generating configuration data files for testing a DFS circuit in a PLD. The DFS circuit provides a programmable multiplier M and a programmable divider D. The methods of the invention reduce both test time and memory storage requirements by reducing an exhaustive set of tests (wherein every value of M and D is tested) to a smaller set of tests in which each M/D ratio is tested to a specified resolution.

According to a first embodiment of the invention, minimum and maximum values are specified for M, D, and M/D. The specified values define an "MD area" that includes all of the MD pairs for which M, D, and M/D fall within ranges defined by the specified minimum and maximum values. A resolution for testing the DFS circuit is also specified. A memory array is then allocated, the array having a size determined by the allowed range of M/D and the specified resolution. Thus, each M/D ratio has a corresponding location in the array, up to the specified resolution.

An MD pair is then selected from the MD area. The M/D ratio is calculated for the MD pair, then idealized (e.g, rounded off) based on the specified resolution. The MD pair is then stored in the array location specified by the idealized M/D ratio. In one embodiment, the MD pair is only stored in the array if no other MD pair has already been stored in that location. In another embodiment, the MD pair overwrites the previous MD pair stored in the location. In other embodiments, the new MD pair and the previously stored MD pair are evaluated and one of the two pairs is retained based on the results of the evaluation. After storing (or selectively storing) the MD pair, another MD pair is selected, and the steps are repeated until each MD pair in the MD area has been processed.

The result of this process is an array of MD pairs that includes either zero or one MD pair for each idealized M/D ratio falling within the specified parameters. Thus, by testing each MD pair within the array, all allowable values of M/D are tested (i.e., all permissible permutations of the input clock frequency are generated), while performing only a subset of the full set of tests. Thus, both testing time and memory storage requirements for test configuration data files are significantly reduced.

In one embodiment, the time required to generate configuration data files is further reduced by using a template configuration data file that includes all configuration information for the PLD except for the programmable M and D values. The various configuration data files required for testing the various M/D ratios are generated by modifying the template configuration data file to include the corresponding M and D values stored in the array. In one embodiment, the template configuration data file includes default M and D values that are overwritten for each new M/D ratio (i.e., for each new configuration data file).

Using this technique, the modified configuration data files are generated so quickly and easily that there is no need to store the files. Each modified configuration data file is generated and transferred to the PLD under test "on the fly". In another embodiment, only the current modified configuration data file is stored. In either case, the need for memory storage space is dramatically reduced over that required using conventional test methods.

Another aspect of the invention provides a method for generating configuration data files for testing programmable circuits in a PLD. In a first embodiment, an array is created that includes set of parameters for the programmable circuit. A template configuration data file is read that includes all configuration information for the PLD except for the parameter values. In one embodiment, the template configuration data file includes default parameter values that are overwritten for each new configuration data file.

After creating the array and reading the template configuration data file, a location in the array is selected that includes a stored set of parameters. The parameter values are read from the selected array location, then translated into bits of configuration data. A modified configuration data file is then generated using the template configuration data file and the bits of configuration data. The PLD is then configured using the modified configuration data file, and the programmable circuit is tested. This process can be repeated for each stored set of parameters in the array.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

In the following description, numerous specific details are set forth to provide a more thorough understanding of the present invention. However, it will be apparent to one skilled in the art that the present invention may be practiced without these specific details.

Figure 1:
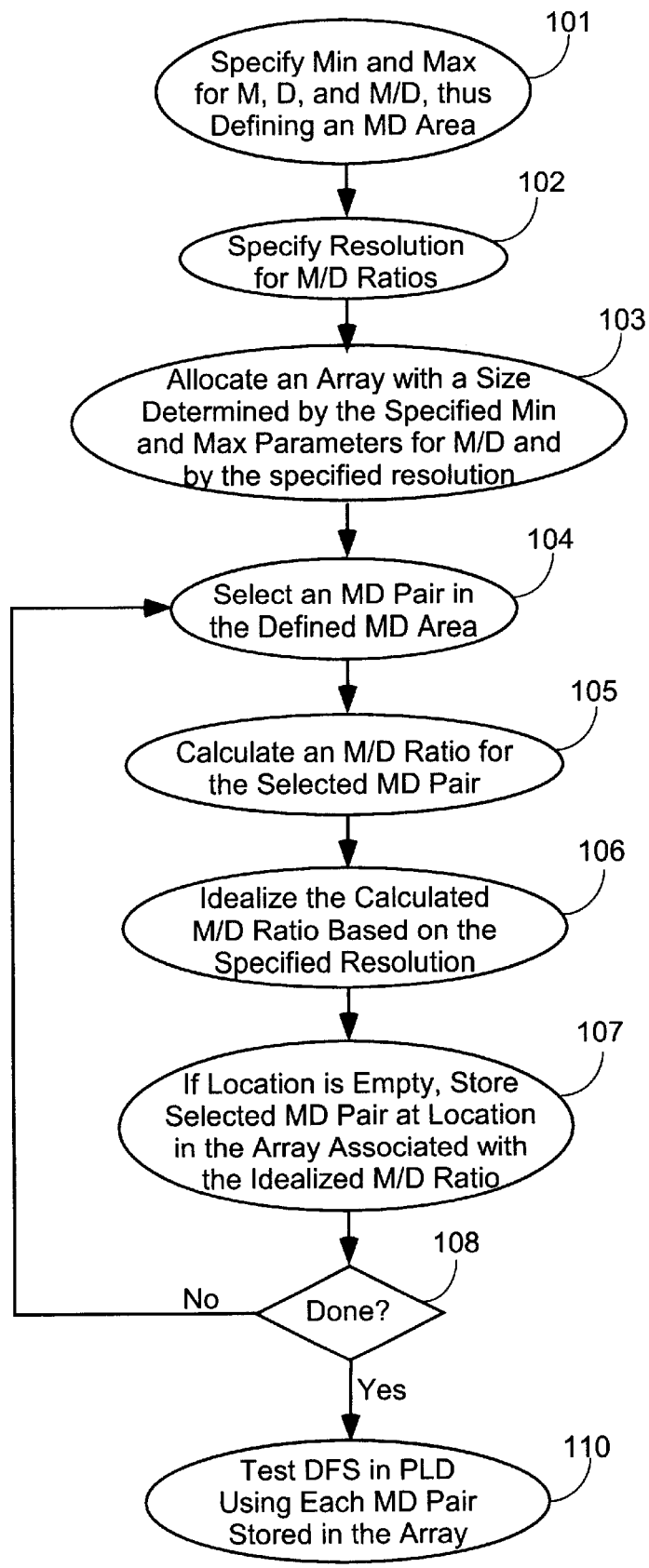
FIG. 1 shows a series of steps for testing a DFS circuit in a PLD, according to one embodiment of the invention.

FIG. 1 shows the steps of a method of testing a DFS circuit in a PLD, according to one embodiment of the invention. The DFS circuit has a programmable multiplier M and a programmable divider D. Thus, the ratio of M/D determines the relationship between the input clock frequency and the output clock frequency of the DFS circuit.

In step 101, minimum and maximum values for M, D, and M/D are specified. These values define an MD area, which is a collection of MD pairs (pairs of M and D values) that meet the specified criteria.

In step 102, a resolution is specified for the M/D ratio. For example, the specified resolution can determine how many decimal points are retained in the M/D ratio. In this example, a resolution of 3 means that the permissible values for M/D differ by 0.001. If the minimum M/D ratio is 1, the maximum M/D ratio is 2, and the resolution is 3, then the possible values of M/D are 1.000, 1.001, 1.002, . . . , 1.999, and 2.000. Thus, the maximum number of unique idealized M/D ratios is 1001.

The order of steps 101–102 is unimportant. The two steps can occur in either order, or simultaneously.

In step 103, a memory array is allocated that has the same number of locations as the maximum number of idealized M/D ratios. Thus, the size of the array is determined by the specified minimum and maximum values for M/D and by the specified resolution.

In step 104, one of the MD pairs in the MD area defined in step 101 is selected. The pairs can be selected in any order, for example, in the order of increasing values of M or D.

In step 105, the M/D ratio for the MD pair is calculated.

In step 106, the calculated M/D ratio is idealized based on the specified resolution. For example, the M/D ratio can be truncated to the specified number of digits, or rounded to the nearest idealized M/D ratio. In one embodiment, values exactly halfway between two idealized M/D ratios are rounded up. For example, when the resolution is 1, a calculated M/D ratio of 0.25 is idealized to 0.3.

After step 106, the selected MD pair has an associated idealized M/D ratio, which in turn has an associated location in the array. In step 107, the selected MD pair is stored in the associated location in the array. In one embodiment, the MD pair is always stored in the array, overwriting any data already present. In another embodiment, the MD pair is only stored in the associated location in the array if no other MD pair is already stored in that location. In other embodiments, the new MD pair and the previously stored MD pair are evaluated and one of the two pairs is retained based on the results of the evaluation.

For example, in one embodiment, the new MD pair and the previously-stored MD pair are compared to see which MD pair yields the calculated M/D ratio that falls closest to the idealized M/D ratio. The MD pair yielding the closest calculated ratio is stored. In one embodiment, if the two MD pairs yield exactly the same ratio, the pair with the larger value of M (or D) is stored. In another embodiment, if the two MD pairs yield exactly the same ratio, the pair with the smaller value of M (or D) is stored.

In step 108, the MD area is evaluated to determine whether steps 104–107 have been performed on all MD pairs in the MD area. If not, steps 104–107 are repeated for another MD pair. When all MD pairs in the MD area have been processed, the array includes either zero or one MD pair for each idealized M/D ratio falling within the specified parameters. Clearly, some locations in the array can be empty, if no MD pair resulted in the corresponding idealized M/D ratio.

In step 110, the DFS circuit is tested using each MD pair stored in the array. Because each idealized M/D ratio obtainable by the DFS circuit has a corresponding MD pair stored in the array, each idealized M/D ratio is tested. However, the total number of tests that must be performed, and the total number of configuration data files necessary to perform the tests, are greatly reduced.

For example, for the Virtex-II DFS circuit, D and M each have a range of 1–4096. For this DFS circuit, the idealized M/D ratio of 2 can be produced using 2048 different MD pairs, 2/1, 4/2, 6/3, . . . , 4096/2048. To prove that the DFS circuit can provide an output clock frequency twice that of the input clock frequency, only one of these MD pairs need be tested. The methods of the invention provide a means for eliminating the tests that use the redundant MD pairs. In fact, by applying the methods of the invention to the Virtex-II DFS circuit, the full set of tests for this circuit is reduced by over 99 per cent.

Figure 2A:
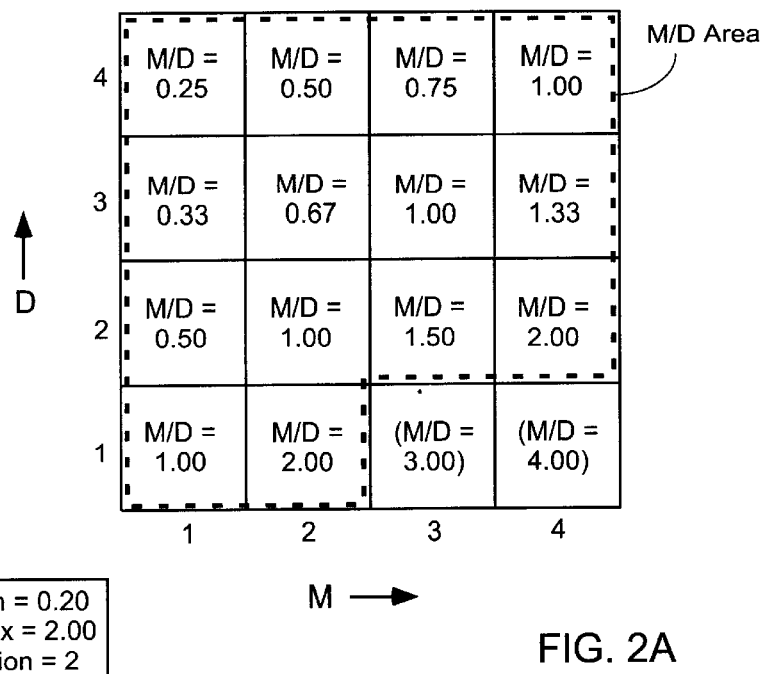
FIG. 2A illustrates the formation of an MD area according to a first example.
Figure 2B:
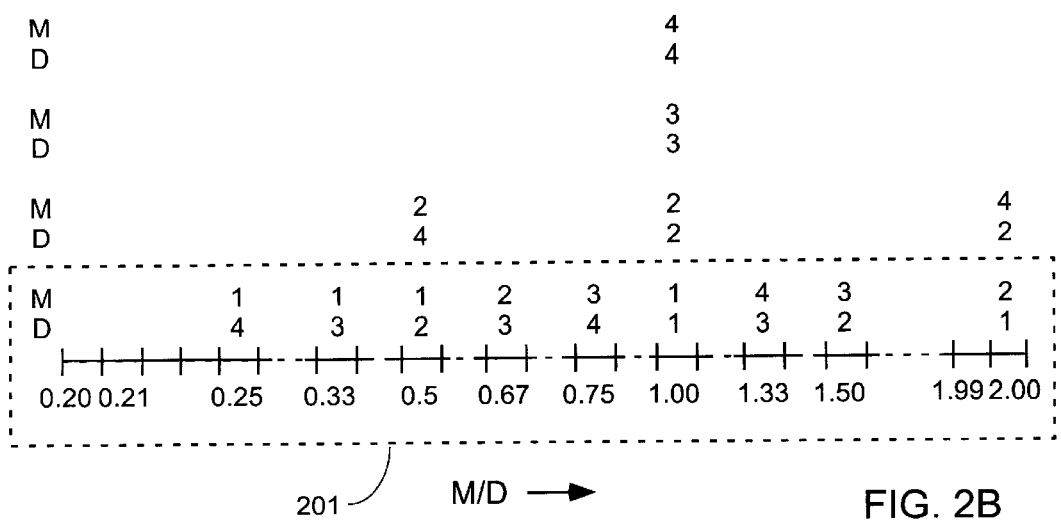
FIG. 2B illustrates the creation of an array of MD pairs according to the first example.

FIGS. 2A and 2B provide a first example helpful in clarifying steps 101–108 of FIG. 1. FIG. 2A illustrates the formation of an MD area when M is 1–4, D is 1–4, M/D is 0.20 to 2.00, and the resolution is 2. The idealized M/D ratios are shown in FIG. 2A for all values of M=1–4 and D=1–4. Because the resolution is 2, two significant digits are shown to the right of the decimal point for the M/D ratios. Two of the resulting M/D ratios (M/D=3.00 for MD pair 3,1 and M/D=4.00 for MD pair 4,1) do not fall within the specified range for M/D. Thus, the MD area for this example is the area included within the dotted line (labeled "MD Area") in FIG. 2A.

FIG. 2B shows the memory array 201 and how the MD pairs are mapped to the locations in the memory array. The locations in the array correspond to the idealized M/D ratios within the specified range of 0.20 to 2.00, with a resolution of two significant digits to the right of the decimal point. (In other words, M/D=0.20, 0.21, 0.22, . . . 1.99, 2.00.) Using the idealized M/D ratios shown in FIG. 2A, the MD pairs are mapped to the array as shown in FIG. 2B.

In the illustrated embodiment, the first MD pair stored in an array location is retained. MD pairs shown outside the dotted line encompassing array 201 are discarded. Note that the initial set of 16 tests (assuming each possible MD pair is used to test the DFS) has been reduced to 9 tests.

Figure 3A:
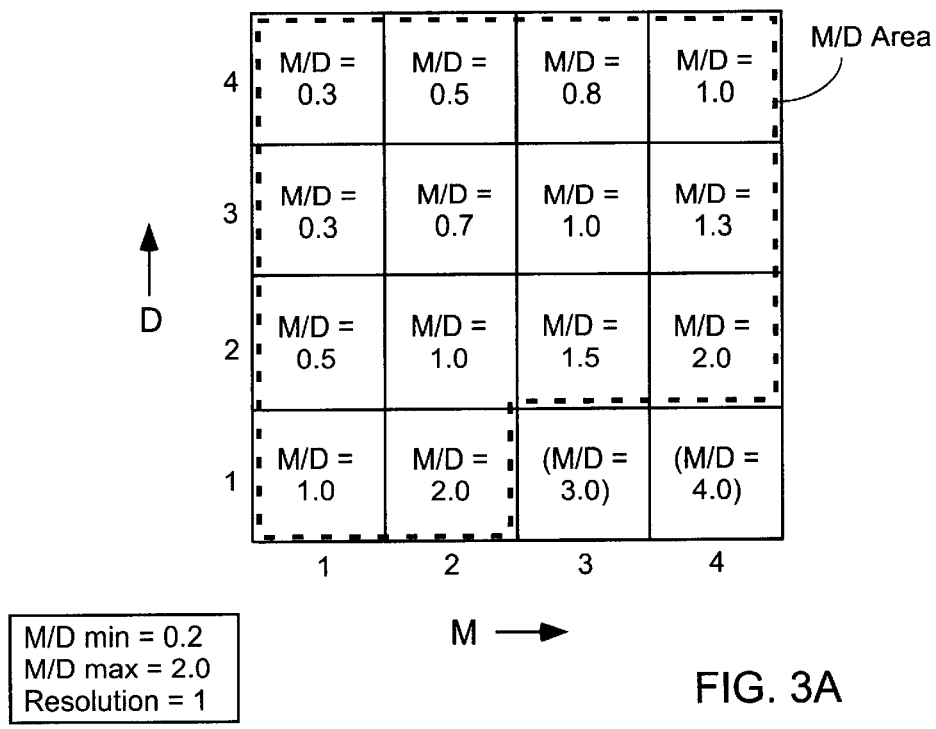
FIG. 3A illustrates the formation of an MD area according to a second example having a different specified resolution.
Figure 3B:
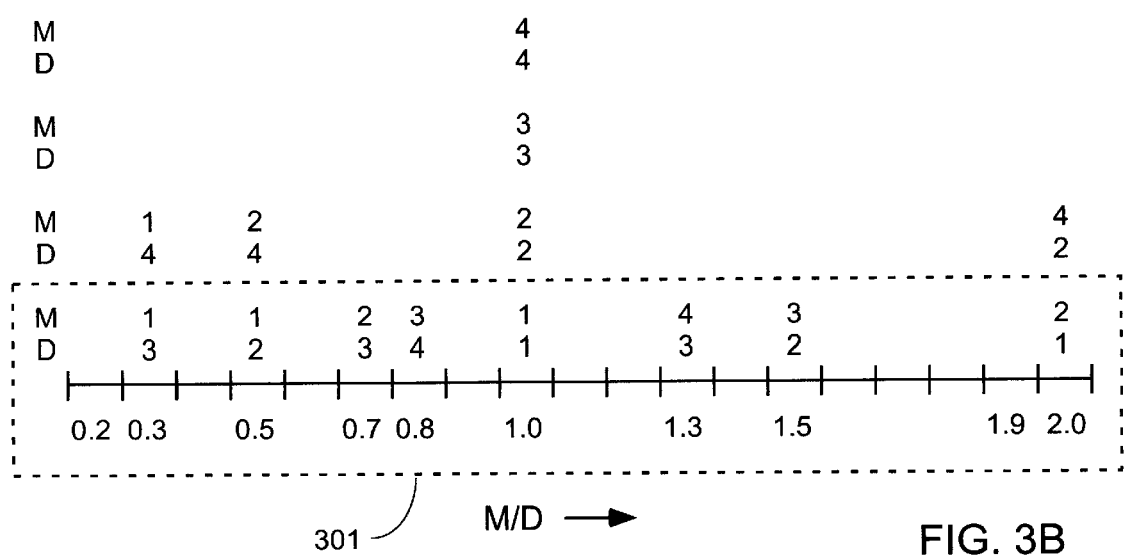
FIG. 3B illustrates the creation of an array of MD pairs according to the second example.

FIGS. 3A and 3B provide a second example helpful in clarifying steps 101–108 of FIG. 1. This example is similar to that of FIGS. 2A and 2B, but in this case the resolution is set to 1 instead of 2.

Thus, FIG. 3A illustrates the formation of an MD area when M is 1–4, D is 1–4, M/D is 0.20 to 2.00, and the resolution is 1. The idealized M/D ratios are shown in FIG. 3A. Because the resolution is 1, only one significant digit is shown to the right of the decimal point for the M/D ratios. Note that this "rounding error" changes some of the idealized M/D ratios. For example, for MD pair 1,4 the M/D ratio is now 0.3, rather than 0.25 as in the previous example. Therefore, this MD pair has an M/D ratio that duplicates the M/D ratio of MD pair 1,3.

FIG. 3B shows the memory array 301 and how the MD pairs of FIG. 3A are mapped to the locations in the memory array. The locations in the array correspond to the idealized M/D ratios within the specified range of 0.2 to 2.0, with a resolution of only one significant digit to the right of the decimal point. (In other words, M/D=0.2, 0.3, 0.4, . . . 1.9, 2.0.) Using the idealized M/D ratios shown in FIG. 3A, the MD pairs are mapped to the array as shown in FIG. 3B.

In this embodiment, the first MD pair stored in an array location is retained. MD pairs shown outside the dotted line encompassing array 301 are discarded. Note that MD pair 1,4 is now discarded as having the same idealized M/D ratio as MD pair 1,3. Thus, the set of 9 tests shown in FIG. 2B has been reduced to 8 tests by specifying a lower resolution.

Figure 4:
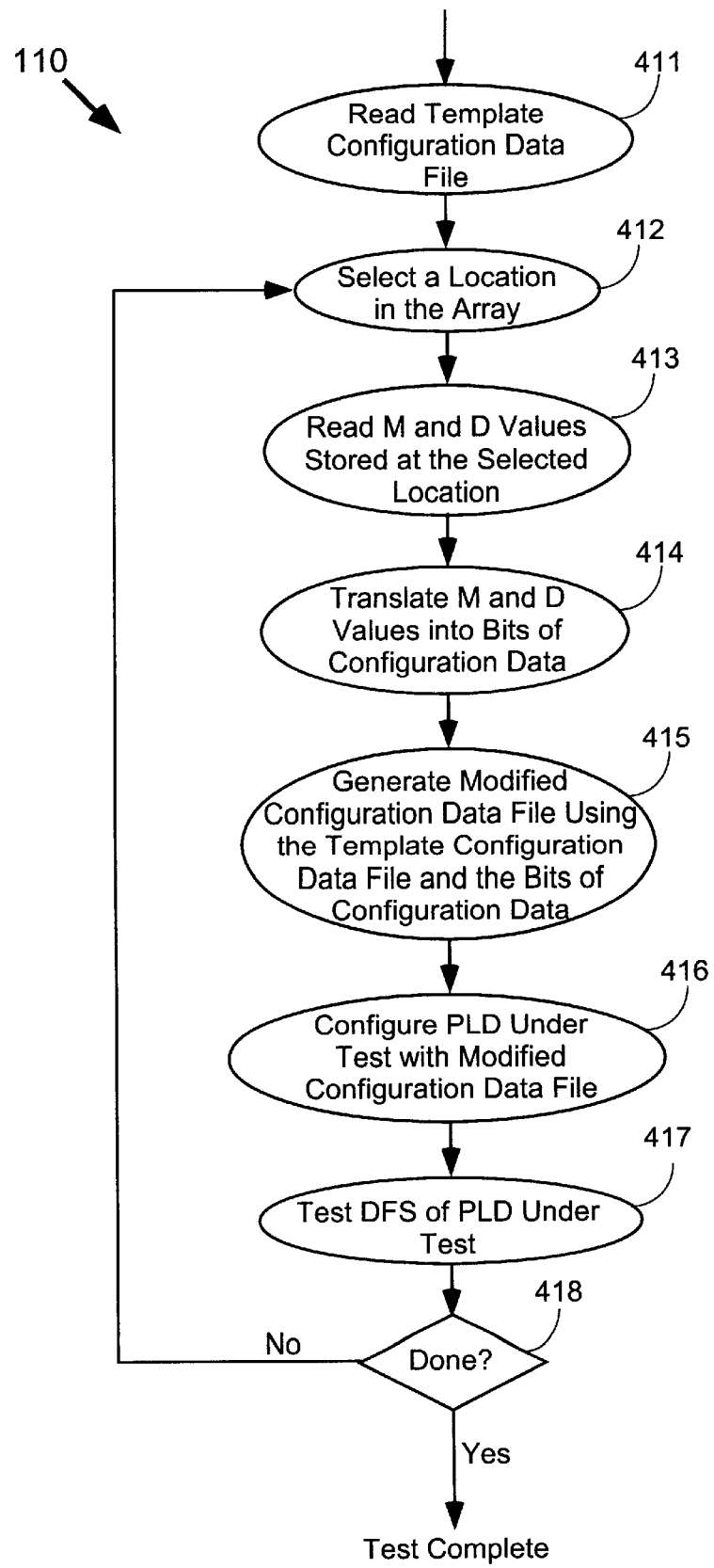
FIG. 4 shows a series of steps for testing a DFS circuit in a PLD using each MD pair stored in the array according to one embodiment of the invention.

FIG. 4 shows a series of steps that can optionally be used to test the DFS circuit using each MD pair stored in the array. In step 411, a template configuration data file is read. The template configuration data file includes all configuration information for the PLD except for the programmable M and D values. In one embodiment, the template configuration data file includes default M and D values.

For example, in an FPGA the configuration data file is a bitstream (i.e., a stream of bits). Within that bitstream, the bits targeted to memory cells controlling the programmable values of M and D are in fixed locations within the bitstream. For each MD pair, these bits can be changed to program the desired M and D values, without altering the rest of the bitstream. Thus, it takes very little time to generate each bitstream—in fact, it takes so little time that there is no need to store the individual bitstreams. Thus, there is a great savings of both time and memory storage space.

In step 412, a location in the array is selected. Preferably, only locations having stored MD pairs are selected. As mentioned above, there may be many empty locations in the array. In step 413, the MD pair at the selected location is read. In step 414, the M and D values in the MD pair are translated into bits of configuration data that, placed in the proper locations in the configuration data file, will result in the correct M and D values being programmed into the PLD.

In step 415, a modified configuration data file is created. In one embodiment, one byte at a time is read from the template configuration data file, and written out to the modified configuration data file. When the bytes including M and D values are read, the bytes are modified to include the bits of configuration data translated from the MD pair. The modified bytes are also written out to the modified configuration data file. In one embodiment, the configuration data file is read and modified in a serial fashion. In other embodiments, the configuration data file is first copied in its entirety, and the copy is then modified. Other variations on this process will be obvious to those of ordinary skill in the art.

In step 416, the PLD under test is configured with the modified configuration data file, and in step 417 the functionality of the DFS circuit is tested with the associated M/D ratio. In step 418, steps 412–417 are repeated for the remaining M/D ratios in the array.

Figure 5:
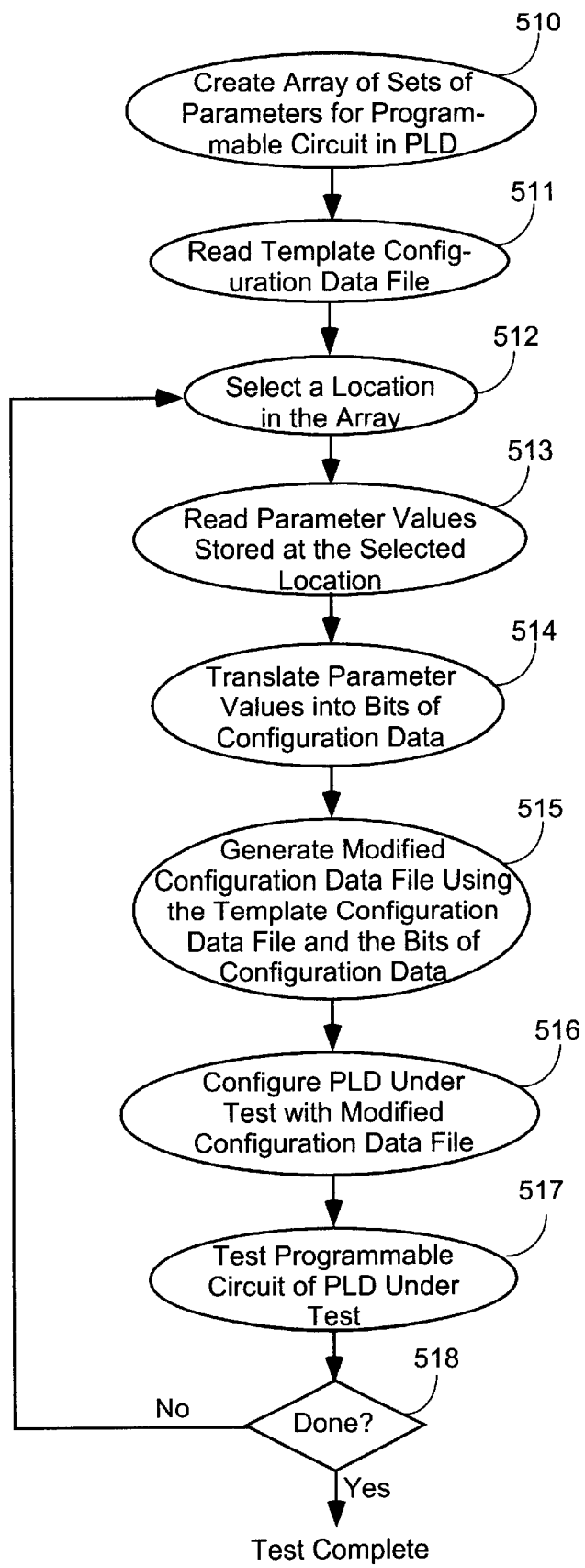
FIG. 5 shows a series of steps for testing a programmable circuit in a PLD.

FIG. 5 shows a series of steps that can be used to test a programmable circuit in a PLD. In step 510, an array is created that includes sets of parameters for the programmable circuit. Preferably, each set of parameters stored in the array yields a unique functional result in the programmable circuit. For example, when the programmable circuit is a DFS circuit, each set of parameters can include a multiplier M and a divider D. Preferably, where each set of parameters includes an MD pair, each set of parameters yields a unique idealized MD ratio for the DFS circuit.

In step 511, a template configuration data file is read. The template configuration data file includes all configuration information for the PLD except for the parameter values. In one embodiment, the template configuration data file includes default parameter values.

In step 512, a location in the array is selected. Preferably, only locations having stored sets of parameters are selected. As mentioned above, there may be many empty locations in the array. In step 513, the parameter values stored at the selected location are read. In step 514, the parameter values are translated into bits of configuration data that, placed in the proper locations in the configuration data file, will result in the correct parameter values being programmed into the PLD.

In step 515, a modified configuration data file is created. As described above in connection with FIG. 4, many different methods can be used to create the modified configuration data file. However, all of these methods combine the data from the template configuration data file with the bits of configuration data generated in step 514.

In step 516, the PLD under test is configured with the modified configuration data file, and in step 517 the functionality of the programmable circuit is tested with the associated set of parameters. In step 518, steps 512–517 are repeated for the remaining sets of parameters stored in the array.

The methods of the present invention can be performed in hardware, software, or any combination thereof, as those terms are currently known in the art. In particular, the present method may be carried out by software, firmware, or microcode operating on a computer or computers of any type. Additionally, software embodying the present invention may comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Further, such software may also be in the form of a computer data signal embodied in a carrier wave, such as that found within the well-known Web pages transferred among computers connected to the Internet. Accordingly, the present invention is not limited to any particular platform, unless specifically stated otherwise in the present disclosure.

Those having skill in the relevant arts of the invention will now perceive various modifications and additions that may be made as a result of the disclosure herein. For example, the above text describes the methods of the invention in the context of PLDs including FPGAs. However, the invention can also be applied to other integrated circuits having DFS circuits with programmable M and D values. Accordingly, all such modifications and additions are deemed to be within the scope of the invention, which is to be limited only by the appended claims and their equivalents.

What is claimed is:

1. A method of testing a digital frequency synthesizer (DFS) circuit in a programmable logic device (PLD), the DFS circuit having a programmable multiplier M and a programmable divider D, M and D being integers, the method comprising:
   specifying minimum and maximum values for M, D, and M divided by D (M/D) to define an MD area to be tested, the MD area including a plurality of MD pairs for which M, D, and M/D fall within ranges defined by the specified minimum and maximum values;
   specifying a resolution for M/D;
   allocating an array with a size determined by the minimum and maximum values specified for M/D and by the specified resolution;
   selecting an MD pair in the MD area;
   calculating an M/D ratio for the selected MD pair;
   idealizing the calculated M/D ratio based on the specified resolution;
   storing the selected MD pair in an array location specified by the idealized M/D ratio; and
   repeating the selecting, calculating, idealizing, and storing steps for each additional MD pair in the MD area.

2. The method of claim 1, wherein storing the selected MD pair in the array location specified by the idealized M/D ratio comprises selectively storing the selected MD pair in the array location specified by the idealized M/D ratio only if the array location is empty.

3. The method of claim 1, wherein storing the selected MD pair in the array location specified by the idealized M/D ratio comprises:
   evaluating the selected MD pair and an MD pair previously stored in the array location; and
   selectively storing the selected MD pair based on results of the evaluating step.

4. The method of claim 1, wherein the DFS circuit supports M and D values in a range from 1 to 4096.

5. The method of claim 1, wherein the PLD is an FPGA.

6. The method of claim 1, further comprising:
   testing the PLD using each MD pair stored in the array.

7. The method of claim 6, wherein testing the PLD using each MD pair stored in the array comprises:
   reading a template configuration data file; and
   for each MD pair stored in the array, performing the following series of steps:
      selecting a location in the array having a stored MD pair,
      reading M and D values from the selected location in the array, the M and D values forming the MD pair stored at the selected location,
      translating the M and D values into bits of configuration data,
      generating a modified configuration data file using the template configuration data file and the bits of configuration data,
      configuring the PLD with the modified configuration data file, and
      testing the functionality of the DFS circuit in the configured PLD.

8. The method of claim 7, wherein the PLD is an FPGA and the modified configuration data file is an FPGA bitstream.

9. A method of generating configuration data files for testing a digital frequency synthesizer (DFS) circuit in a programmable logic device (PLD), the DFS circuit having a programmable multiplier M and a programmable divider D, M and D being integers, the method comprising:
   specifying minimum and maximum values for M, D, and M divided by D (M/D) to define an MD area to be tested, the MD area including a plurality of MD pairs for which M, D, and M/D fall within ranges defined by the specified minimum and maximum values;
   specifying a resolution for M/D;
   allocating an array with a size determined by the minimum and maximum values specified for M/D and by the specified resolution;
   for each MD pair in the MD area, performing the following series of steps:
      selecting an MD pair in the MD area,
      calculating an M/D ratio for the selected MD pair,
      idealizing the calculated M/D ratio based on the specified resolution, and
      storing the selected MD pair in an array location specified by the idealized M/D ratio;
   reading a template configuration data file; and
   generating a modified configuration data file for each MD pair stored in the array, using the template configuration data file and M and D values forming the MD pair.

10. The method of claim 9, wherein storing the selected MD pair in the array location specified by the idealized M/D ratio comprises selectively storing the selected MD pair in the array location specified by the idealized M/D ratio only if the array location is empty.

11. The method of claim 9, wherein storing the selected MD pair in the array location specified by the idealized M/D ratio comprises:
   evaluating the selected MD pair and an MD pair previously stored in the array location; and
   selectively storing the selected MD pair based on results of the evaluating step.

12. The method of claim 9, wherein generating the modified configuration data file comprises:
   reading the M and D values forming the MD pair;
   translating the M and D values into bits of configuration data; and
   generating the modified configuration data file using the template configuration data file and the bits of configuration data.

13. The method of claim 9, wherein the DFS circuit supports M and D values in a range from 1 to 4096.

14. The method of claim 9, wherein the PLD is an FPGA and the modified configuration data file is an FPGA bitstream.

15. The method of claim 9, further comprising:
   testing the PLD using the modified configuration data files generated for each MD pair stored in the array.

16. A method of testing a digital frequency synthesizer (DFS) circuit in a programmable logic device (PLD), the DFS circuit having a programmable multiplier M and a programmable divider D, M and D being integers, the method comprising:
   specifying minimum and maximum values for M, D, and M divided by D (M/D) to define an MD area to be tested, the MD area including a plurality of MD pairs for which M, D, and M/D fall within ranges defined by the specified minimum and maximum values;

specifying a resolution for M/D;

allocating an array with a size determined by the minimum and maximum values specified for M/D and by the specified resolution;

selecting an MD pair in the MD area;

calculating an M/D ratio for the selected MD pair;

idealizing the calculated M/D ratio based on the specified resolution; and storing the selected MD pair in an array location specified by the idealized M/D ratio.

17. The method of claim 16, wherein storing the selected MD pair in the array location specified by the idealized M/D ratio comprises selectively storing the selected MD pair in the array location specified by the idealized M/D ratio only if the array location is empty.

18. The method of claim 16, wherein storing the selected MD pair in the array location specified by the idealized M/D ratio comprises:

evaluating the selected MD pair and an MD pair previously stored in the array location; and selectively storing the selected MD pair based on results of the evaluating step.

19. The method of claim 16, wherein the DFS circuit supports M and D values in a range from 1 to 4096.

20. The method of claim 16, wherein the PLD is an FPGA.

21. The method of claim 16, further comprising:

testing the PLD using the MD pair stored in the array.

22. The method of claim 21, wherein testing the PLD using the MD pair stored in the array comprises:

reading a template configuration data file;

reading M and D values from the array, the M and D values forming the MD pair stored in the array;

translating the M and D values into bits of configuration data;

generating a modified configuration data file using the template configuration data file and the bits of configuration data;

configuring the PLD with the modified configuration data file; and testing the functionality of the DFS circuit in the configured PLD.

23. The method of claim 21, wherein the PLD is an FPGA and the modified configuration data file is an FPGA bitstream.

24. The method of claim 16, further comprising:

reading a template configuration data file; and generating a modified configuration data file for the MD pair stored in the array, using the template configuration data file and M and D values forming the MD pair.

25. The method of claim 24, wherein generating the modified configuration data file comprises:

reading the M and D values forming the MD pair;

translating the M and D values into bits of configuration data; and generating the modified configuration data file using the template configuration data file and the bits of configuration data.

26. A method of testing a programmable circuit in a programmable logic device (PLD), the programmable circuit having one or more programmable parameters, the method comprising:

creating an array, wherein a plurality of locations in the array each store a set of parameters;

reading a template configuration data file for the PLD; and for each set of parameters stored in the array, performing the following series of steps:

selecting a location in the array having a stored set of parameters, reading a set of values from the selected location in the array, the set of values forming the set of parameters stored at the selected location, translating the set of values into bits of configuration data, and generating a modified configuration data file using the template configuration data file and the bits of configuration data.

27. The method of claim 26, further comprising, for each set of parameters stored in the array:

configuring the PLD with the modified configuration data file; and testing the functionality of the programmable circuit in the configured PLD.

28. The method of claim 26, wherein generating a modified configuration data file using the template configuration data file and the bits of configuration data comprises:

reading a group of bits from the template configuration data file to create an internal group of bits;

modifying the internal group of bits with the bits of configuration data when the group of bits influences any of the set of parameters on the PLD; and writing the internal group of bits to the modified configuration data file.

29. The method of claim 26, wherein generating a modified configuration data file using the template configuration data file and the bits of configuration data comprises:

reading a group of bits from the template configuration data file to create an internal group of bits;

modifying the internal group of bits with the bits of configuration data when the group of bits influences any of the set of parameters on the PLD; and writing the internal group of bits to the PLD, wherein the modified configuration data file is stored within the PLD.

30. The method of claim 26, wherein the PLD is an FPGA and the modified configuration data file is an FPGA bitstream.

31. The method of claim 26, wherein the programmable circuit is a Digital Frequency Synthesizer circuit and the set of parameters includes a multiplier M and a divider D.

32. The method of claim 26, wherein the template configuration data file includes all configuration information for the PLD except for the parameter values.

33. The method of claim 26, wherein the template configuration data file includes configuration data specifying default parameter values that are overwritten for each modified configuration data file.

34. The method of claim 26, wherein each set of parameters stored in the array yields a unique functional result in the programmable circuit.

* * * * *